(12) United States Patent
Ma et al.

(10) Patent No.: US 10,969,689 B2
(45) Date of Patent: Apr. 6, 2021

(54) APPARATUS FOR MAKING DIRECT WRITING SCREEN PLATE AND USING METHOD THEREOF

(71) Applicant: Jiangsu GIS Laser Technologies Inc., Xuzhou (CN)

(72) Inventors: Lloyd Ma, Xuzhou (CN); Jingzhou Wu, Xuzhou (CN)

(73) Assignee: JIANGSU GIS LASER TECHNOLOGIES INC., Xuzhou (CN)

( * ) Notice: Subject to any disclaimer, the term of this patent is extended or adjusted under 35 U.S.C. 154(b) by 182 days.

(21) Appl. No.: 16/077,735

(22) PCT Filed: Apr. 1, 2017

(86) PCT No.: PCT/CN2017/079183
§ 371 (c)(1),
(2) Date: Aug. 14, 2018

(87) PCT Pub. No.: WO2018/120481
PCT Pub. Date: Jul. 5, 2018

(65) Prior Publication Data
US 2019/0346767 A1  Nov. 14, 2019

(30) Foreign Application Priority Data
Dec. 31, 2016 (CN) .......................... 201611267959.7

(51) Int. Cl.
*G03F 7/20* (2006.01)
*G03F 7/12* (2006.01)
*G03F 9/00* (2006.01)

(52) U.S. Cl.
CPC .............. *G03F 7/2055* (2013.01); *G03F 7/12* (2013.01); *G03F 7/70275* (2013.01);
(Continued)

(58) Field of Classification Search
CPC ............... G03F 7/2055; G03F 7/70383; G03F 7/70391; G03F 7/70483; G03F 7/70491;
(Continued)

(56) References Cited

U.S. PATENT DOCUMENTS

| 2006/0221322 A1* | 10/2006 | Tinnemans | G03F 7/70291 355/69 |
| 2014/0053399 A1* | 2/2014 | Askebjer | H05K 3/0017 29/846 |
| 2014/0075398 A1* | 3/2014 | Isoyan | G03F 7/70641 716/53 |

FOREIGN PATENT DOCUMENTS

| CN | 1877456 A | 12/2006 |
| CN | 102368138 A | 3/2012 |

(Continued)

*Primary Examiner* — Michelle M Iacoletti
(74) *Attorney, Agent, or Firm* — Bayramoglu Law Offices LLC (57) ABSTRACT

The present invention discloses an apparatus for making direct writing screen plate and a using method thereof. The present invention provides a direct writing screen plate making apparatus and a focal plane control method. A Z-axis controller is used to pre-establish a mapping relation between the focal plane position of the scanning band to be scanned in the next step and the scanning platform position signal. During the next step of scanning, the position of the optical lens is adjusted according to the mapping relation, thus avoiding the problem of inconsistency between the calculated focal plane and the actual focal plane caused by the position deviation between the assembled displacement sensor and the optical lens. The present invention also provides a method for exposing a region of interest and a method for compensating the on-line real-time light uniformity.

8 Claims, 3 Drawing Sheets

(52) U.S. Cl.
CPC ...... *G03F 7/70383* (2013.01); *G03F 7/70508* (2013.01); *G03F 7/70641* (2013.01); *G03F 9/7026* (2013.01); *G03F 7/70291* (2013.01)

(58) Field of Classification Search
CPC ............. G03F 7/70525; G03F 7/70641; G03F 9/7026; G03F 9/7023; G03F 7/12; G03F 7/70508; G03F 7/70275; G03F 7/70291; G03F 7/2057; G03F 7/70591; B41C 1/145
See application file for complete search history.

(56) References Cited

FOREIGN PATENT DOCUMENTS

| | | | |
|---|---|---|---|
| CN | 102566325 | A | 7/2012 |
| CN | 103744271 | A | 4/2014 |
| CN | 104865800 | A | 8/2015 |
| JP | 2001082925 | A | 3/2001 |
| WO | 2008119517 | A2 | 10/2008 |

* cited by examiner

APPARATUS FOR MAKING DIRECT WRITING SCREEN PLATE AND USING METHOD THEREOF

CROSS REFERENCE TO RELATED APPLICATIONS

This application is the national phase entry of International Application PCT/CN2017/079183, filed on Apr. 1, 2017, which is based upon and claims priority to Chinese Patent Application No. 201611267959.7, filed on Dec. 31 2016, the entire contents of which are incorporated herein by reference.

TECHNICAL FIELD

The present invention relates to the technical field of screen plate making, in particular to an apparatus for making a direct writing screen plate and a using method thereof.

BACKGROUND

In the existing laser direct writing apparatus, a displacement sensor beside an exposure point is generally used to measure the distance between an optical lens and a screen plate at a position of the exposure point. Although, the position of the exposure point is close to the displacement sensor and the distance between the exposure point and the displacement sensor is short, the exposure point and the displacement sensor are not actually at the same position. Therefore, the distance measured by the displacement sensor is not the actual distance between the optical lens and the screen plate, although the measured distance and the actual distance are very close in most cases.

In the prior art, a focal plane of the optical lens at the exposure point is adjusted by using the above-mentioned measured distance, since the assembly position of the displacement sensor is inconsistent with the position of the exposure point, adjusting the focal plane of the optical lens by using the distance measured by the displacement sensor will lead to errors.

Additionally, in the existing laser direct writing apparatus, a digital micromirror device is often used in the whole plate surface. Since the digital micromirror device consists of a large number of micromirrors, when the function of some of the micromirrors is disabled, the whole digital micromirror device is scrapped, resulting in the shortcomings of low utilization rate and relatively short service life of the digital micromirror device.

Additionally, in the existing laser direct writing apparatus, the energy distribution of each trace on the scanning trace of each micromirror point in the scanning process of the digital micromirror device is not uniform, resulting in the problem of nonuniform energy output distribution on the digital micromirror device, which affects the image exposure quality.

SUMMARY

The present invention aims to provide an apparatus for making a direct writing screen plate and a using method thereof, which can solve the above-mentioned problems.

In order to achieve the above-mentioned objective, the present invention provides an apparatus for making a direct writing screen plate used for a plate making process of screen printing, including a host, a motion system, a light source controller, a light source, a data processing module, a digital micromirror device, a Z-axis controller, an optical lens, a signal splitter, a displacement sensor, a Z-axis lifting mechanism and a micro-motion adjusting mechanism.

The motion system includes a stepping platform, a scanning platform and a platform driver, wherein the platform driver is connected to the host and used for driving the stepping platform and the scanning platform to move.

The light source controller is connected to the host and controls the on-off state and light intensity of the light source, the light source provides continuous light energy for the digital micromirror device, and the light outputted by the digital micromirror device becomes uniform surface light after passing through the optical lens.

The data processing module is connected to the host and drives the digital micromirror device to complete the generation and projection of an image under the control of the host.

The optical lens is driven to move up and down in the vertical direction by the Z-axis lifting mechanism and the micro-motion adjusting mechanism. The Z-axis lifting mechanism plays a role in low frequency adjustment, and the micro-motion adjusting mechanism plays a role in high frequency adjustment.

The Z-axis controller is connected to the host and is used for comprehensively processing z-axis reading transmitted by the Z-axis lifting mechanism, measurement data transmitted by the displacement sensor and position data transmitted by the signal splitter, wherein the Z-axis controller calculates a position of the focal plane of the optical lens at each scanning position according to the Z-axis reading, the measurement data and the position data, then combines a calculated focal plane position with a position signal number of the scanning platform sent by the signal splitter synchronously and establishes a one-to-one mapping relation. Based on the one-to-one mapping relation, the Z-axis controller also controls the actions of the Z-axis lifting mechanism and the micro-motion adjusting mechanism for adjusting the distance between the optical lens and the to-be-exposed screen plate. The optical lens adjusts the height under the indirect control of the Z-axis controller to focus the image projected by the digital micromirror device clearly and then projects the image onto the surface of the screen plate for exposure.

The signal splitter is connected to the scanning platform and sends the position signal of the scanning platform to the data processing module and the Z-axis controller synchronously.

The displacement sensor is flush juxtaposed to the optical lens. The displacement sensor is used for measuring the actual distance between the optical lens and the to-be-exposed screen plate and transmitting a measurement result to the Z-axis controller.

The stepping platform is used for carrying the to-be-exposed screen plate and driving the screen plate to move. The scanning platform is used for carrying the Z-axis lifting mechanism, the micro-motion adjusting mechanism, the digital micromirror device, the optical lens and the displacement sensor and driving them to move.

Preferably, an error correction unit is integrated in the data processing module of the above-mentioned direct writing screen plate making apparatus, and the error correction unit is used for correcting the position signal of the scanning platform sent by the signal splitter.

Preferably, an object detection sensor and a length measuring guide rail with an encoder are arranged on the screen plate clamp of the stepping platform. The object detection sensor and the length measuring guide rail with the encoder are connected to the host.

Preferably, in the above-mentioned direct writing screen plate making apparatus, the reflective surface of the digital micromirror device is parallel to the to-be-scanned exposure surface. The scanning direction of the scanning axis on the scanning platform forms a certain included angle with the column direction of the micromirror array on the digital micromirror device, and the range of the included angle is limited to nine angular value regions as follows:

angle range 1: 7.1150°-7.1350°;
angle range 2: 6.3302°-6.3502°;
angle range 3: 5.7006°-5.7206°;
angle range 4: 5.1844°-5.2044°;
angle range 5: 4.7536°-4.7736°;
angle range 6: 4.3887°-4.4087°;
angle range 7: 4.0756°-4.0956°;
angle range 8: 3.8041°-3.8241°;
angle range 9: 3.5663°-3.5863°.

Preferably, the above-mentioned screen plate clamp of the stepping platform is provided with an object detection sensor and a guide rail with an encoder. The object detection sensor and the guide rail with the encoder are connected to the host through the sensor controller, respectively.

When the digital micromirror device is obliquely installed to be used at an included angle with the scanning direction, the present invention also provides a method for processing the TIF format layout, which includes the following steps:

(a) first, installing image processing software in the host;

(b) setting the path and the image processing parameter of the to-be-processed TIF image in the image processing software in step (a);

(c) reading the TIF image by the image processing software;

(d) identifying the resolution of the TIF image by the image processing software;

(e) identifying the outline of the pattern in the TIF image by the image processing software;

(f) converting the outline of the pattern identified in step (e) into a polygon expressed by vectors by the image processing software, the polygon is a region surrounded by a plurality of end-to-end line segments expressed by vectors;

(g) performing a computational geometry processing of an optical proximity effect on the polygon generated in step (f) by the image processing software according to the image processing parameter, and correcting a pattern deviation introduced by the optical proximity effect during exposure by the processed polygon;

(h) performing a scaled transform on a graph obtained in step (g) by the image processing software according to the image processing parameter and performing a scaled processing on the whole image to obtain a new vectogram to meet the requirement of production;

(i) storing the graph generated in step (h) in the memory of the host by the image processing software for later use.

The present invention also provides an optical compensation method used on the direct writing screen plate making apparatus, which is used for solving the problem of nonuniform energy output distribution on the digital micromirror device. The specific technical scheme includes the following steps:

(a) light intensity distribution calibration: placing a light intensity detection equipment at the bottom of the digital micromirror device, turning on the digital micromirror device completely, capturing the optical energy distribution by the light intensity detection device, and generating energy compensation parameter according to the optical energy distribution data captured by the light intensity detection device;

(b) feeding back the compensation parameter obtained in step (a) to the data processing module:

(c) when generating image frame data, using the compensation parameter to reduce the number of times that the micromirror is opened in the region with the excessively high energy on the digital micromirror device based on the region with the lowest energy by the data processing module to achieve the objective of equalizing the energy.

The present invention also provides an exposure method of the direct writing screen plate making apparatus including the following steps:

(a) screen plate preparation step: sending an instruction to the platform driver by the host, driving the stepping platform to move to the position where the upper screen plate is arranged by the platform driver, placing the screen plate on the stepping platform, fixing the screen plate by a screen plate fixing device arranged on the stepping platform; during the fixing process, transmitting the reading to the host by the object detection sensor and the length measuring guide rail on the fixing device;

(b) graphic transmission step: sending the layout to the data processing module and sending an instruction to close the digital micromirror device to the data processing module at the same time by the host, if the data returned by the object detection sensor and the length measuring guide rail in this step is incorrect, generating a warning of the abnormal screen plate by the host, and if the screen plate is normal, proceeding with the next step;

(c) exposure preparation step: calculating an initial position of the exposure point and then controlling the platform driver to drive the stepping platform and the scanning platform to move to the initial position of the exposure point by the host;

(d) active focusing step: triggering the Z-axis controller by the host, controlling the Z-axis lifting mechanism and the micro-motion adjusting mechanism to drive the optical lens to carry out active focusing and lock the focal plane of the lens by the Z-axis controller;

(e) layout ready signal and graph generation step: after receiving the layout by the data processing module and being ready, returning a ready signal, then continuously generating strip-shaped graphic data according to the width size of the digital micromirror device according to the layout received in this step by the data processing module;

(f) light source turning on step: receiving an instruction from the host and turning on the light source by the light source controller;

(g) frame pattern generation step: generating frame patterns at different positions according to the strip-shaped graphic data generated in step (e) in combination with the position parameter in the scanning direction and using region of a micromirror array on the digital micromirror device by the data processing module;

(h) forward scanning step: moving the scanning platform forward to the end position of forward scanning at a uniform speed, during the movement, continuously feeding back position signals to the data processing module through the signal splitter by the scanning platform; correcting received position signals to obtain accurate position signals by the data processing module; and according to the accurate position signals, controlling the digital micromirror device to project the frame pattern at a designated position until the processing of strip-shaped graph in a forward direction is finished to complete forward exposure;

(i) exposure strip replacement step: after the forward scanning is completed, moving the stepping platform by a distance of a scanning width toward the to-be-exposed region, thus entering the reverse scanning strip;

(j) reverse scanning step: reversely moving the scanning platform to the end position of reverse scanning at a uniform speed, during the movement, continuously feeding back the position signals to the data processing module by the scanning platform; correcting the received position signals to obtain accurate position signals by the data processing module; and according to the accurate position signals, controlling the digital micromirror device to project the frame pattern at the designated position until the processing of strip-shaped graph in a reverse direction is finished to complete reverse exposure; a reverse process is the same as a forward process except that scanning drive directions of the scanning platforms are opposite;

(k) entering the forward scanning process again after the reverse scanning of step (j) is completed, so forth until all strip-shaped graphs are processed, and the entire exposure process is completed.

The present invention also provides a method of using the digital micromirror device in the direct writing screen plate making apparatus, selecting a part of the region in the digital micromirror device as a region of interest, and the other part being idle. After the service in the region of interest expires, the idle region will be activated, which is used for overcoming the defects of low utilization rate and relatively short service life of the digital micromirror device.

The present invention also provides a focal plane control method in the working process of the direct writing screen plate making apparatus, which includes the following steps:

(a) before the exposure starts, controlling the platform driver to move the displacement sensor to a starting point of the first scanning band by the host, and then completing a scanning action; placing the optical lens adjacent to and contiguous with the displacement sensor without covering the first scanning band; covering the first scanning band and measuring height data at different positions on the first scanning band by the displacement sensor; during a scanning operation, synchronously reading measured data of the displacement sensor and the Z-axis reading on the Z-axis mechanism by the Z-axis controller, and calculating a position of the focal plane of the optical lens at each scanning position according to the data read by the Z-axis controller; then combining a calculated focal plane position with a position signal number of scanning platform sent by the signal splitter synchronously and establishing a one-to-one mapping relation by the Z-axis controller;

(b) driving the screen plate forward by one step by the stepping platform, scanning back from an end position of the step (a) by the scanning platform; during a scanning back process, driving the Z-axis lifting mechanism and the micro-motion adjusting mechanism to adjust a position of the optical lens according to mapping data established in step (a) to complete a focal plane correction by the Z-axis controller; while scanning back, covering and measuring actual height position data of a second scanning band by the displacement sensor, and establishing a mapping relationship between a position of the focal plane of the second scanning band and the scanning platform position signal at the same time by the Z-axis controller;

(c) driving the screen plate forward by one more step by the stepping platform, scanning back from an end position of step (b) once more by the scanning platform; during the scanning back process, driving the Z-axis lifting mechanism and the micro-motion adjusting mechanism to adjust a position of the optical lens according to mapping data established in step (b) to complete a focal plane correction by the Z-axis controller; while scanning back, covering and measuring actual height position data of a third scanning band by the displacement sensor, and establishing a mapping relationship between a focal plane position of the third scanning band and the scanning platform position signal at the same time by the Z-axis controller;

(d) repeating the above-mentioned step (b) and step (c) until the scanning is finished.

The technical effects of the present invention are as follows.

(1) The present invention provides an apparatus for making a direct writing screen plate and a focal plane control method in the working process of the direct writing screen plate making apparatus. A Z-axis controller is used to pre-establish a mapping relation between the position of the focal plane of the scanning band to be scanned in the next step and the scanning platform position signal. During the next step of scanning, the position of the optical lens is adjusted according to the mapping relation, thus avoiding the problem of inconsistency between the calculated focal plane and the actual focal plane caused by the assembly position deviation between the displacement sensor and the exposure point.

As a preferred solution, when the scanning direction of the digital micromirror device forms a predetermined included angle with the row direction or column direction of the micromirror array on the digital micromirror device, data resolution of the scanned image is high, refresh rate of the pattern is high, and a pattern generated by exposure is good.

Further preferably, an object detection sensor and a length measuring guide rail with an encoder are arranged on the screen plate clamp of the stepping platform. The object detection sensor and the length measuring guide rail with the encoder are connected to the host, respectively. The object detection sensor detects whether there is a screen plate on the clamp, and the length measuring guide rail measures the size of the screen plate and uploads the measurement data to the host. The host compares the transmitted screen plate size data with the size of the to-be-exposed graph to avoid the problem of dull apparatus caused by the mismatching between the two.

(2) The method of the region of interest in the digital micromirror device provided by the present invention can improve the reuse rate of the digital micromirror device and reduce the hardware cost in later maintenance, not only increasing the refresh rate of the digital micromirror device, but also reducing the amount of data in the process of data communication.

(3) When using oblique laser direct writing technology, in the prior art, a TIF format image is enlarged, and the amount of calculation and data in this process is extremely large. The TIF image processing method provided by the present invention vectorizes the TIF image, compared with the prior art, in the processing of the method provided by the present invention, the amount of calculation and data is small, the resolution of the obtained patterns is high, which is beneficial to the low-load operation of the apparatus and can improve the refresh rate of the pattern of the digital micromirror device (DMD).

(4) In the prior art, the energy of each trace in the scanning process of the outputted light is nonuniform, resulting in the problem of nonuniform energy output distribution on the digital micromirror device. The optical compensation method provided by the present invention overcomes the above-mentioned disadvantages.

DETAILED DESCRIPTION

Hereinafter, the technical solution of the present invention will be described clearly and completely with reference to the drawings and embodiments.

Embodiment 1

Figure 1:
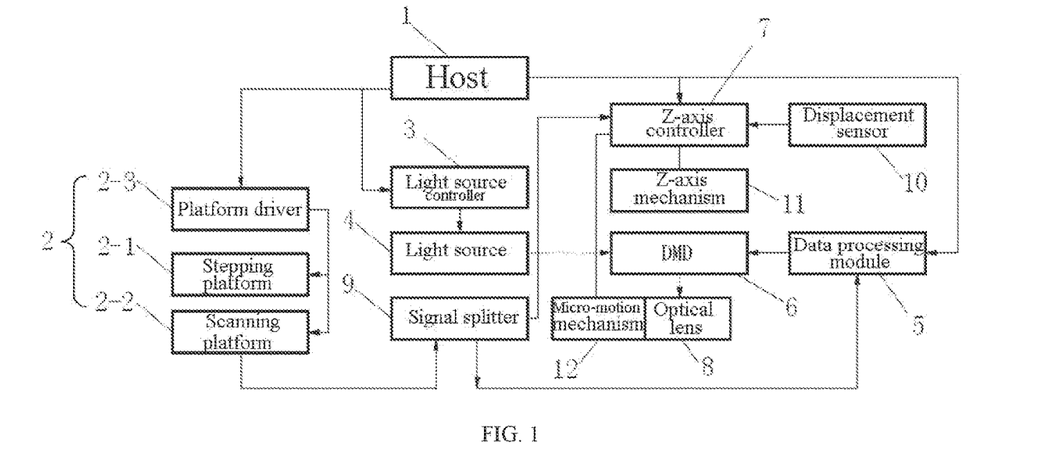
FIG. 1 is a structural block diagram of the direct writing screen plate making apparatus according to the present invention.
Figure 2:
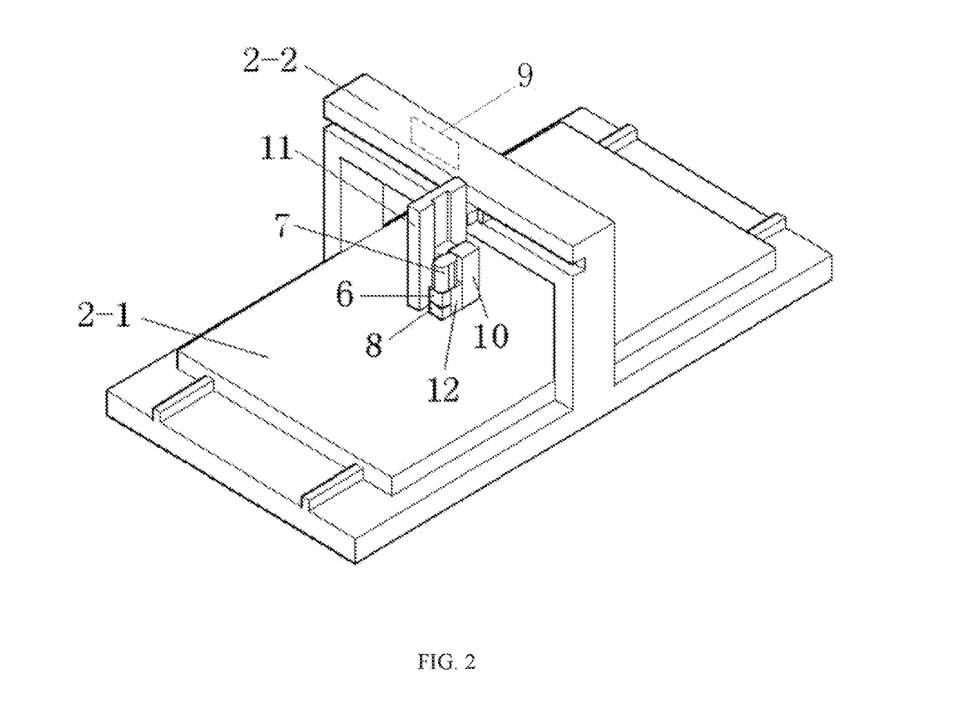
FIG. 2 is a schematic diagram showing a three-dimensional structure of the direct writing screen plate making apparatus according to the present invention.

Referring to FIG. 1 and FIG. 2, an apparatus for making a direct writing screen plate used for a plate making process of screen printing, includes host 1, motion system 2, light source controller 3, light source 4, data processing module 5, digital micromirror device 6, Z-axis controller 7, optical lens 8, signal splitter 9, displacement sensor 10, Z-axis lifting mechanism 11 and micro-motion adjusting mechanism 12.

Motion system 2 includes stepping platform 2-1, scanning platform 2-2 and platform driver 2-3, wherein platform driver 2-3 is connected to host 1 and used for driving stepping platform 2-1 and scanning platform 2-2 to move.

Light source controller 3 is connected to host 1 and controls the on-off state and light intensity of light source 4, light source 4 provides continuous output light energy for digital micromirror device 6, and the light outputted by digital micromirror device 6 becomes uniform surface light after passing through optical lens 8;

Data processing module 5 is connected to host 1 and drives digital micromirror device 6 to complete the generation and projection of an image under the control of the host 1.

Optical lens 8 is driven to move up and down in the vertical direction by Z-axis lifting mechanism 11 and micro-motion adjusting mechanism 12. Z-axis lifting mechanism 11 plays a role in low frequency adjustment, and micro-motion adjusting mechanism 12 plays a role in high frequency adjustment.

Z-axis controller 7 is connected to host 1 and used for comprehensively processing Z-axis reading transmitted by Z-axis lifting mechanism 11, measurement data transmitted by displacement sensor 10 and position data transmitted by signal splitter 9. Z-axis controller 7 also controls the actions of Z-axis lifting mechanism 11 and micro-motion adjusting mechanism 12 for adjusting the distance between optical lens 8 and the to-be-exposed screen plate. Optical lens 8 adjusts the height under the indirect control of Z-axis controller 7 to focus the image projected by digital micromirror device 6 clearly and then projects the image onto the surface of the screen plate for exposure.

Signal splitter 9 is connected to scanning platform 2-2 and sends the position signal of scanning platform 2-2 to data processing module 5 and Z-axis controller 7 synchronously.

Displacement sensor 10 is flush juxtaposed to optical lens 8. Displacement sensor 10 is used for measuring the actual distance between optical lens 8 and to-be-exposed screen plate and transmitting a measurement result to Z-axis controller 7.

Stepping platform 2-1 is used for carrying the to-be-exposed screen plate and driving the screen plate to move. Scanning platform 2-2 is used for carrying Z-axis lifting mechanism 11, micro-motion adjusting mechanism 12, digital micromirror device 6, optical lens 8 and displacement sensor 10 and driving them to move.

Figure 6:
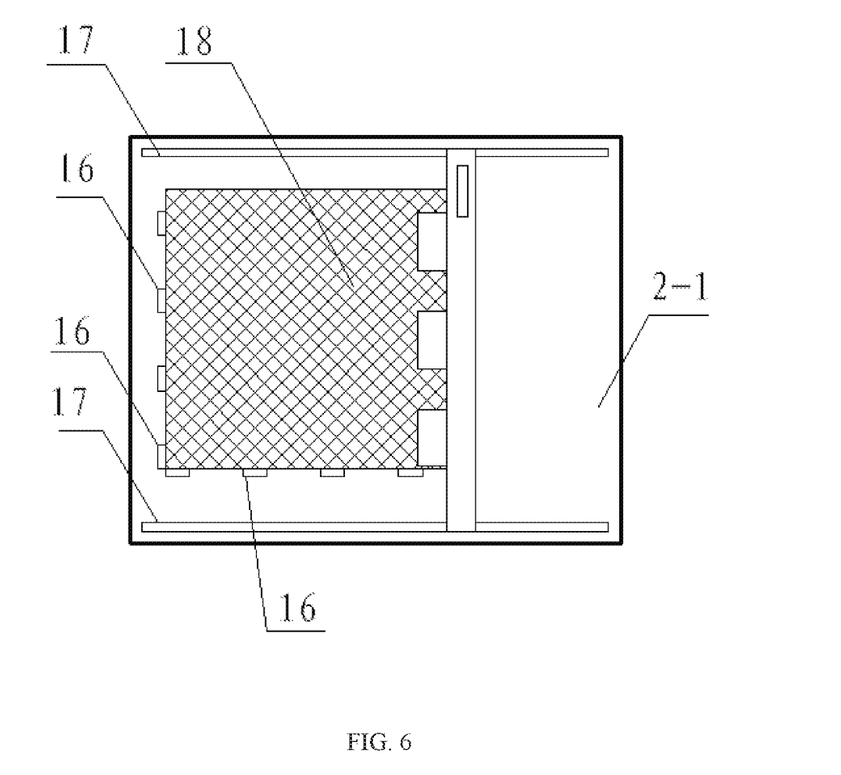
FIG. 6 is a schematic diagram showing a sensor installed on a stepper platform clamp.

Referring to FIG. 6, the screen plate clamp of stepping platform 2-1 of the embodiment is provided with object detection sensor 16 and length measuring guide rail 17 with an encoder. Object detection sensor 16 and length measuring guide rail 17 with the encoder are connected to host 1 through the sensor controller, respectively. Screen plate 18 is clamped by the clamp of stepping platform 2-1. Object detection sensor 16 detects whether there is screen plate 18 on the clamp, and length measuring guide rail 17 measures the size of screen plate 18 and uploads the measurement data to host 1. Host 1 compares the transmitted screen plate size data with the size of the to-be-exposed graph to avoid the problem of dull apparatus which may be caused due to the mismatching between the two.

Embodiment 2

Figure 4:
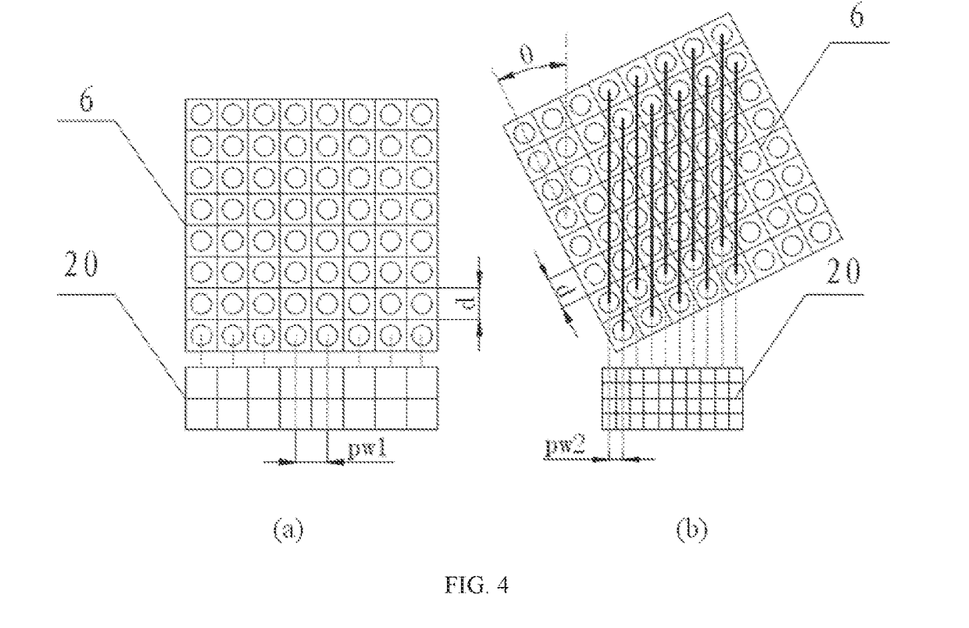
FIG. 4(a)-4(b) are comparison diagrams of the forward scanning process and the oblique scanning process.

Referring to FIG. 4 (b), the scanning direction of the digital micromirror device 6 in FIG. 4 (b) forms an included angle $\theta$ with the row direction of the micromirror array in the digital micromirror device. Under the situation of included angle $\theta$, the micromirror array in the digital micromirror device is repeated once every several rows, and to-be-scanned image region 20 is divided into subdivision blocks with a spacing of pw2, pw2=d×sin $\theta$;

Referring to FIG. 4 (a), the scanning direction of the digital micromirror device 6 in FIG. 4 (b) does not include an included angle with the row direction of the micromirror array in the digital micromirror device, to-be-scanned image region 20 is divided into subdivision blocks with a spacing of pw1, pw1=d. Since pw2=d×sin $\theta$, obviously, pw2 is smaller than pw1, when the scanning direction of digital micromirror device 6 forms an included angle $\theta$ with the row direction of the micromirror array in the digital micromirror device, the to-be-scanned image region 20 is divided more finely, the data resolution is high, the refresh rate of the pattern is high, and the pattern generated by exposure is good.

Therefore, the specific situation of the embodiment is as follows. Referring to FIG. 1 and FIG. 2, a direct writing screen plate making apparatus used for a plate making process of screen printing, includes host 1, motion system 2, light source controller 3, light source 4, data processing module 5, digital micromirror device 6, Z-axis controller 7, optical lens 8, signal splitter 9, displacement sensor 10, Z-axis lifting mechanism 11 and micro-motion adjusting mechanism 12.

Motion system 2 includes stepping platform 2-1, scanning platform 2-2 and platform driver 2-3, wherein platform driver 2-3 is connected to host 1 and used for driving stepping platform 2-1 and scanning platform 2-2 to move.

Light source controller 3 is connected to host 1 and controls the on-off state and light intensity of light source 4, light source 4 provides continuous output light energy for digital micromirror device 6, and the light outputted by digital micromirror device 6 becomes uniform surface light after passing through optical lens 8, Data processing module 5 is connected to host 1 and drives digital micromirror device 6 to complete the generation and projection of an image under the control of the host 1.

Optical lens 8 is driven to move up and down in the vertical direction by Z-axis lifting mechanism 11 and micro-motion adjusting mechanism 12. Z-axis lifting mechanism 11 plays a role in low frequency adjustment, and micro-motion adjusting mechanism 12 plays a role in high frequency adjustment.

Z-axis controller 7 is connected to host 1 and is used for comprehensively processing Z-axis reading transmitted by Z-axis lifting mechanism 11, measurement data transmitted by displacement sensor 10 and position data transmitted by signal splitter 9. Z-axis controller 7 also controls the actions of Z-axis lifting mechanism 11 and micro-motion adjusting mechanism 12 for adjusting the distance between optical lens 8 and the to-be-exposed screen plate. Optical lens 8 adjusts the height under the indirect control of Z-axis controller 7 to focus the image projected by digital micromirror device 6 clearly and then projects the image onto the surface of the screen plate for exposure.

Signal splitter 9 is connected to scanning platform 2-2 and sends the position signal of scanning platform 2-2 to data processing module 5 and Z-axis controller 7 synchronously.

Displacement sensor 10 is flush juxtaposed to optical lens 8. Displacement sensor 10 is used for measuring the actual distance between optical lens 8 and to-be-exposed screen plate and transmitting a measurement result to Z-axis controller 7.

Stepping platform 2-1 is used for carrying the to-be-exposed screen plate and driving the screen plate to move. Scanning platform 2-2 is used for carrying Z-axis lifting mechanism 11, micro-motion adjusting mechanism 12, digital micromirror device 6, optical lens 8 and displacement sensor 10 and driving them to move.

When digital micromirror device 6 scans and exposes a photosensitive material member, the included angle $\theta$ between the scanning direction and the column direction of the micromirror array on digital micromirror device 6 is 3.8141°, and a center spacing between two adjacent micromirror units on digital micromirror device 6 is d. At this time, a spacing between scanning strips of to-be-scanned region 20 in the scanning direction subdivided by the micromirror unit is PW2, PW2=d×sin $\theta$=0.06652d. Compared with the prior art, the scanning strip subdivided by the micromirror unit has an increase of about 15 times in tightness. Each point on a single scanning strip is scanned by digital micromirror device 6, and the point is repeatedly covered by the micromirror unit once when every 15 rows of the micromirror unit are passed by.

Figure 5:
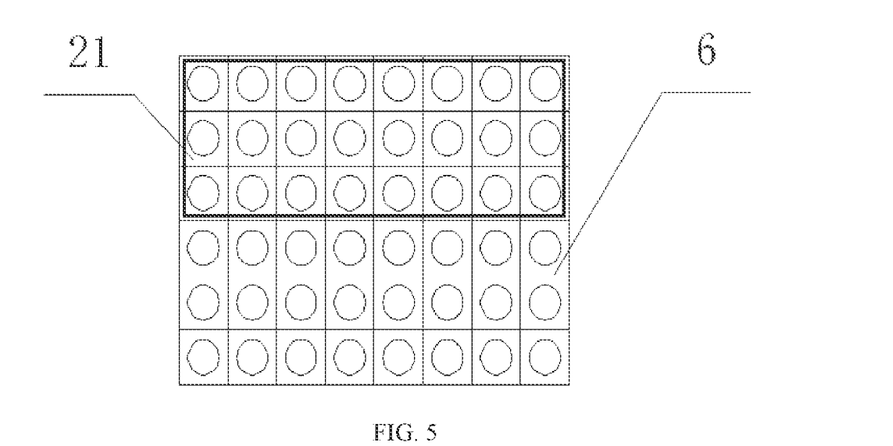
FIG. 5 is a schematic diagram showing the position of the region of interest in the digital micromirror device.

Additionally, in this embodiment, referring to FIG. 5, digital micromirror device 6 is divided into two parts for use, and a region with half of the row number divided on digital micro-mirror device 6 is region of interest 21. This arrangement can improve the reuse rate of digital micromirror device 6 (DMD). In this embodiment, DMD is divided into two parts, and the reuse rate of DMD has been doubled, reducing the input of hardware cost in later maintenance, increasing the refresh rate of the DMD, and also reducing the amount of data in the data communication process.

Embodiment 3

In tilting laser direct writing technology, TIF images used in the printing field cannot be used directly. In the prior art, an image is enlarged, but the amount of calculation and data in this process is extremely large. Compared with the prior art, in the processing process of this embodiment, the amount of calculation and data is small, the resolution of the obtained patterns is high, which is beneficial for the low-load operation of the apparatus and can improve the refresh rate of the pattern of the digital micromirror device (DMD).

This embodiment converts a TIF image into a vectogram, and the specific implementation process adopts the following process.

Referring to FIG. 1, processing method of the TIF image on the direct writing screen plate making apparatus includes the following steps:

(a) first, installing image processing software in host 1;

(b) setting the path and the image processing parameter of the to-be-processed TIF image in the image processing software in step (a);

(c) reading the TIF image by the image processing software;

(d) identifying the resolution of the TIF image by the image processing software;

(e) identifying the outline of the pattern in the TIF image by the image processing software;

(f) converting the outline of the pattern identified in step (e) into a polygon expressed by vectors by the image processing software, the polygon is a region surrounded by a plurality of end-to-end line segments expressed by vectors;

(g) performing a computational geometry processing of an optical proximity effect on the polygon generated in step (f) by the image processing software according to the image processing parameter, and correcting a graphic deviation introduced by the optical proximity effect during exposure by the processed polygon;

(h) performing a scaled transform on a graph obtained in step (g) by the image processing software according to the image processing parameter and performing a scaled processing on the whole image to obtain a new vectogram to meet the requirement of production;

(i) storing the graph generated in step (h) in the memory of host 1 by the image processing software for later use.

Embodiment 4

In the prior art, the energy of each trace in the scanning process of output light is nonuniform, resulting in the problem of nonuniform energy output distribution on the digital micromirror device 6. This embodiment uses a light compensation technology of an optical compensation method to overcome the above-mentioned disadvantages. The specific implementation process of this embodiment is as follows:

(a) light intensity distribution calibration: placing a light intensity detection equipment at the bottom of digital micromirror device 6, turning the digital micromirror device completely, capturing the optical energy distribution by the light intensity detection equipment, and generating energy compensation parameter according to the optical energy distribution data captured by the light intensity detection equipment;

(b) feeding back the compensation parameter obtained in step (a) to data processing module 5;

(c) when generating image frame data, using the compensation parameter to reduce the number of times that the micromirror is opened in the region with the excessively high energy on the digital micromirror device 6 based on the region with the lowest energy by the data processing module 5 to achieve the objective of equalizing the energy.

Embodiment 5

In the existing laser direct writing apparatus, a displacement sensor beside an exposure point is generally used to measure the distance between an optical lens and a screen plate at a position of the exposure point. Although, the position of the exposure point is close to the displacement sensor and the distance between the exposure point and the displacement sensor is short, the exposure point and the displacement sensor are not actually at the same position. Therefore, the distance measured by the displacement sensor is not the actual distance between the optical lens and the screen plate, although the measured distance and the actual distance are very close in most cases.

Figure 3:
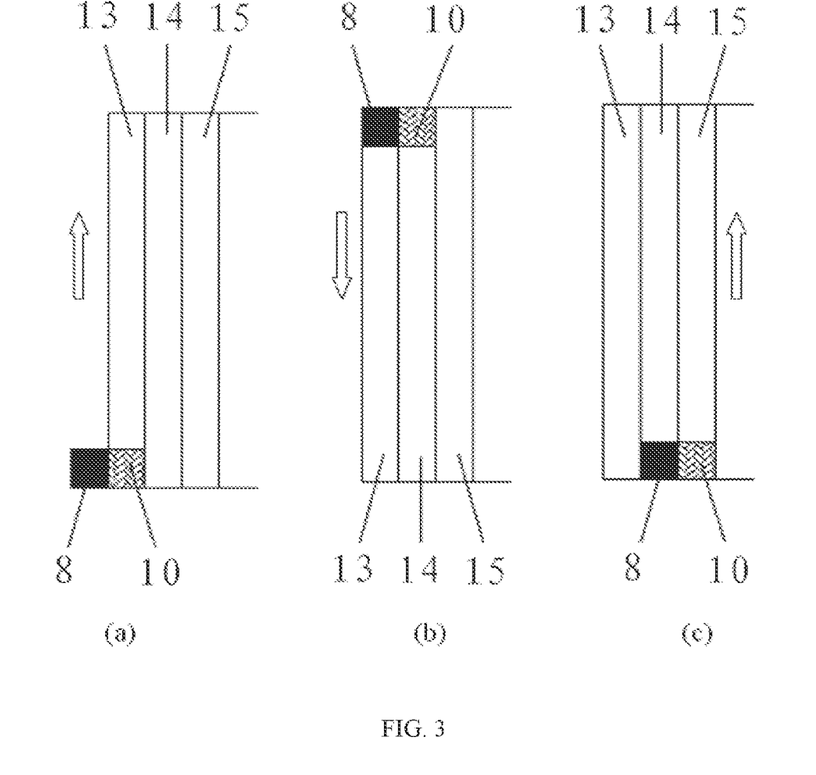
FIGS. 3(a)-3(c) are schematic diagrams showing the implementation process of the focal plane control method.

Referring to FIG. 1, FIG. 2 and FIG. 3, the focal plane control process in the working process of the direct writing screen plate making apparatus includes the following steps:

(a) before the exposure starts, controlling the platform driver 2-3 to move displacement sensor 10 to a starting point of first scanning band 13 by host 1, and then completing a scanning action; referring to FIG. 3 (a), leaning optical lens 8 on displacement sensor 10 without covering first scanning band 13; covering the first scanning band 13 and measuring height data at different positions on first scanning band 13 by displacement sensor 10; during the scanning operation, synchronously reading measured data of displacement sensor 10 and the Z-axis reading on Z-axis lifting mechanism 11 and calculating a position of the focal plane of optical lens 8 at each scanning position according to the read data by Z-axis controller 7; then combining a calculated focal plane position with a position signal number of scanning platform 2-2 sent by signal splitter 9 synchronously and establishing a one-to-one mapping relation by Z-axis controller 7;

(b) driving the screen plate forward by one step by stepping platform 2-1, scanning back from an end position of step (a) by scanning platform 2-2; during a scanning back process, driving Z-axis lifting mechanism 11 and micro-motion adjusting mechanism 12 to adjust a position of optical lens 8 according to mapping data established in step (a) to complete a focal plane correction by Z-axis controller 7; referring to FIG. 3 (b), while scanning back, covering and measuring actual height position data of second scanning band 14 by displacement sensor 10, and establishing a mapping relationship between a position of the focal plane of second scanning band 14 and the scanning platform position signal at the same time by Z-axis controller 7;

(c) driving the screen plate forward by one more step by stepping platform 2-1, scanning back from an end position of step (b) once more by scanning platform 2-2; during scanning back process, driving Z-axis lifting mechanism 11 and micro-motion adjusting mechanism 12 to adjust a position of the optical lens 8 according to mapping data established in step (b) to complete a focal plane correction by Z-axis controller 7: while scanning back, referring to FIG. 3 (c), measuring actual height position data of third scanning band 15 by displacement sensor 10, and establishing a mapping relationship between a position of the focal plane of third scanning band 15 and the scanning platform position signal at the same time by Z-axis controller 7;

(d) repeating the above-mentioned step (b) and step (c) until the scanning is finished.

In this embodiment, Z-axis controller 7 is used to pre-establish a mapping relation between the position of the focal plane of the scanning band to be scanned in the next step and the scanning platform position signal. During the next step of scanning, the position of optical lens 8 is adjusted according to the mapping relation, thus avoiding the problem of inconsistency between the calculated focal plane and the actual focal plane caused by the assembly position deviation between displacement sensor 10 and optical lens 8.

Embodiment 6

Referring to FIG. 1, FIG. 2 and FIG. 6, the exposure process of direct writing screen plate making apparatus includes the following steps:

(a) screen plate preparation step: sending an instruction to platform driver 2-3 by host 1, driving the stepping platform 2-1 to move to the position where the upper screen plate is arranged by platform driver 2-3, placing the screen plate 18 on the stepping platform 2-1, fixing screen plate 18 by a screen plate fixing device arranged on stepping platform 2-1; during the fixing process, transmitting a measurement result to host 1 by object detection sensor 16 and length measuring guide rail 17 on the fixing device;

(b) graphic transmission step: sending the layout to data processing module 5 and sending an instruction to close digital micromirror device 6 to the data processing module 5 at the same time by host 1, if the data returned by object detection sensor 16 and the length measuring guide rail 17 in step (a) is incorrect, generating a warning of the abnormal screen plate 18 by host 1, and if the screen plate is normal, proceeding with the next step;

(c) exposure preparation step: calculating an initial position of the exposure point and then controlling platform driver 2-3 to drive stepping platform 2-1 and scanning platform 2-2 to move to the initial position of the exposure point by host 1;

(d) active focusing step: triggering Z-axis controller 7 by host 1, controlling Z-axis lifting mechanism 11 and micro-motion adjusting mechanism 12 to drive optical lens 8 to carry out active focusing and lock focal plane of the lens by Z-axis controller 7;

(e) layout ready signal and graph generation step: after receiving the layout by data processing module 5 and being ready, returning a ready signal, then continuously generating strip-shaped graphic data according to the width size of digital micromirror device 6 according to the layout received in step (b) by data processing module 5;

(f) light source turning on step: receiving an instruction from host 1 and turning on light source 4 by light source controller 3;

(g) frame pattern generation step: generating frame patterns at different positions according to the strip-shaped graphic data generated in step (e) in combination with the position parameter in the scanning direction and using region of a micromirror array on digital micromirror device 6 by data processing module 5;

(h) forward scanning step: moving scanning platform 2-2 forward to the end position of forward scanning at a uniform speed, during the movement, continuously feeding back position signals to data processing module 5 through the signal splitter 9 by scanning platform 2-2; correcting received position signals to obtain accurate position signals by data processing module 5; and according to the accurate position signals, controlling digital micromirror device 6 to project the frame pattern at a designated position until the processing of strip-shaped graph in a forward direction is finished to complete forward exposure;

(i) exposure strip replacement step: after the forward scanning is completed, moving stepping platform 2-1 by a distance of a scanning width toward a to-be-exposed region to enter a reverse scanning strip;

(j) reverse scanning step: reversely moving scanning platform 2-2 to an end position of reverse scanning at the uniform speed, during movement, continuously feeding back position signals to data processing module 5 by scanning platform 2-2; correcting received position signals to obtain accurate position signals by data processing module 5: and according to the accurate position signals, controlling digital micromirror device 6 to project the frame pattern at the designated position until the processing of strip-shaped graph in a reverse direction is finished to complete reverse exposure; a reverse process is the same as a forward process except that scanning drive directions of scanning platforms 2-2 are opposite;

(k) entering the forward scanning process again after the reverse scanning of step (j) is completed, so forth until all strip-shaped graphs are processed and the entire exposure process is completed.

The above-mentioned embodiments illustrate the technical solution of the present invention in detail. The above-mentioned embodiments are only used to help understand the core idea of the present invention. Those skilled in the art, according to the idea of the present invention, can make changes in the specific implementation and application scope. Therefore, based on the implementation and embodiments in this specification, all other embodiments obtained by those of ordinary skill in the art without creative effort shall be considered as falling within the scope of the present invention. In conclusion, the contents of this specification should not be regarded as limitations to the present invention.

What is claimed is:

1. An apparatus for making a direct writing screen plate, comprising:
    a host, a motion system, a light source controller, a light source, a data processing module, a digital micromirror device, a Z-axis controller, an optical lens, a signal splitter, a displacement sensor, a Z-axis lifting mechanism and a micro-motion adjusting mechanism; wherein
    the motion system comprises a stepping platform, a scanning platform and a platform driver, wherein the platform driver is connected to the host and is configured to drive the stepping platform and the scanning platform to move;
    the stepping platform is configured to carry a to-be-exposed screen plate and drive the screen plate to move, the scanning platform is configured to carry the Z-axis lifting mechanism, the micro-motion adjusting mechanism, the digital micromirror device, the optical lens and the displacement sensor and is configured to drive the Z-axis lifting mechanism, the micro-motion adjusting mechanism, the digital micromirror device, the optical lens and the displacement sensor to move;
    the light source controller is connected to the host and is configured to control an on-off state and a light intensity of the light source, the light source is configured to provide continuous output light energy for the digital micromirror device, and light outputted by the digital micromirror device becomes uniform surface light after passing through the optical lens;
    the data processing module is connected to the host and is configured to drive the digital micromirror device to complete an image generation and projection under a control of the host;
    the optical lens is configured to be driven to move up and down in a vertical direction by the Z-axis lifting mechanism and the micro-motion adjusting mechanism; and the optical lens is configured to adjust a height to focus an image projected by the digital micromirror device clearly and then is configured to project the image onto a surface of the screen plate for exposure;
    the displacement sensor is flush juxtaposed to the optical lens, the displacement sensor is configured to measure a distance between the optical lens and the to-be-exposed screen plate and is configured to transmit distance data to the Z-axis controller;
    the signal splitter is connected to the scanning platform and is configured to send position data of the scanning platform in a scanning direction to the data processing module and the Z-axis controller synchronously;
    the Z-axis controller is connected to the host and is configured to receive the distance data transmitted by the displacement sensor and the position data transmitted by the signal splitter, wherein the Z-axis controller is configured to calculate a position of a focal plane of the optical lens at each scanning position according to the distance data and the position data, then combine a calculated focal plane position with the position data of the scanning platform and to establish a one-to-one mapping relation; based on the one-to-one mapping relation, the Z-axis controller also is configured to control actions of the Z-axis lifting mechanism and the micro-motion adjusting mechanism for adjusting the distance between the optical lens and the to-be-exposed screen plate.

2. The apparatus for making the direct writing screen plate according to claim 1, wherein a reflective surface of the digital micromirror device is parallel to a to-be-scanned exposure surface, the scanning direction of a scanning axis on the scanning platform forms a certain included angle with a column direction of a micromirror array on the digital micromirror device, and an angle range of the included angle is limited to nine angular value regions as follows:
    angle range 1: 7.1150°-7.1350°;
    angle range 2: 6.3302°-6.3502°;
    angle range 3: 5.7006°-5.7206°;
    angle range 4: 5.1844°-5.2044°;
    angle range 5: 4.7536°-4.7736°;
    angle range 6: 4.3887°-4.4087°;
    angle range 7: 4.0756°-4.0956°;
    angle range 8: 3.8041°-3.8241°;
    angle range 9: 3.5663°-3.5863°.

3. A method of processing a TIF image used on the apparatus according to claim 2, comprising the following steps:
    (a) first, installing image processing software in a host;
    (b) setting a path and an image processing parameter of a to-be-processed TIF image in the image processing software in step (a);
    (c) reading the to-be-processed TIF image by the image processing software;
    (d) identifying resolution of the to-be-processed TIF image by the image processing software;
    (e) identifying an outline of a pattern in the to-be-processed TIF image by the image processing software;

(f) converting the outline of the pattern identified in step (e) into a polygon expressed by vectors by the image processing software, the polygon is a region surrounded by a plurality of end-to-end line segments expressed by the vectors;

(g) performing a computational geometry processing of an optical proximity effect on the polygon generated in step (f) by the image processing software according to the image processing parameter to obtain a processed polygon, and correcting a pattern deviation introduced by the optical proximity effect during exposure by the processed polygon;

(h) performing a scaled transform on the processed polygon obtained in step (g) by the image processing software according to the image processing parameter and performing a scaled processing on the whole image to obtain a new vectogram to meet the requirement of production;

(i) storing the graph generated in step (h) in a memory of the host by the image processing software for later use.

4. The apparatus for making the direct writing screen plate according to claim 2, wherein a screen plate clamp of the stepping platform is provided with an object detection sensor and a guide rail with an encoder, the guide rail with an encoder and the object detection sensor are connected to the host through a sensor controller, respectively.

5. The apparatus for making the direct writing screen plate according to claim 1, wherein a screen plate clamp of the stepping platform is provided with an object detection sensor and a guide rail with an encoder, the guide rail with an encoder and the object detection sensor are connected to the host through a sensor controller, respectively.

6. An optical compensation method used on the apparatus according to claim 1, comprising the following steps:

(a) light intensity distribution calibration: placing a light intensity detection equipment at a bottom of the digital micromirror device, turning the digital micromirror device completely, capturing the optical energy distribution by the light intensity detection equipment, and generating an energy compensation parameter according to optical energy distribution data captured by the light intensity detection equipment;

(b) feeding back the energy compensation parameter obtained in step (a) to the data processing module;

(c) when generating image frame data, using the energy compensation parameter to reduce a number of times that the micromirror is opened in a region with an energy value on the digital micromirror device based on a region with another energy value by the data processing module to achieve the objective of equalizing energy.

7. A method of exposing a screen plate using the apparatus of claim 1, comprising the following steps:

(a) screen plate preparation step: sending an instruction to a platform driver by a host, driving a stepping platform to move to a position where an upper screen plate is arranged by the platform driver, placing the screen plate on the stepping platform, fixing the screen plate by a screen plate fixing device arranged on the stepping platform; during fixing process, detecting the screen plate by an object detection sensor and measuring a length of the screen plate by a length measuring guide rail to obtain a measurement result, and transmitting the measurement result to the host, wherein the object detection sensor and the length measuring guide rail are arranged on the fixing device;

(b) graphic transmission step: sending a layout to a data processing module and sending an instruction for stopping a digital micromirror device to the data processing module at the same time by the host;

(c) exposure preparation step: calculating an initial position of an exposure point and then controlling the platform driver to drive the stepping platform and a scanning platform to move to the initial position of the exposure point by the host;

(d) active focusing step: triggering a Z-axis controller by the host, controlling a Z-axis lifting mechanism and a micro-motion adjusting mechanism to drive an optical lens to carry out active focusing and lock a focal plane of the optical lens by the Z-axis controller;

(e) layout ready signal and graph generation step: after receiving the layout by the data processing module, returning a ready signal, then generating strip-shaped graphic data according to a width size of the digital micromirror device according to the layout received in step (b) by the data processing module;

(f) light source turning-on step: receiving an instruction from the host and turning on a light source by a light source controller;

(g) frame pattern generation step: generating frame patterns at different positions according to the strip-shaped graphic data generated in step (e) in combination with position data in the scanning direction and using region of the micromirror array on the digital micromirror device by the data processing module;

(h) forward scanning step: moving the scanning platform forward to an end position of forward scanning at a uniform speed, during the movement, continuously feeding back the position data to the data processing module through a signal splitter by the scanning platform; and according to the position data, controlling the digital micromirror device to project the frame pattern at a designated position until the processing of a strip-shaped graph in a forward direction is finished to complete forward exposure;

(i) exposure strip replacement step: after the forward scanning is completed, moving the stepping platform by a distance of a scanning width toward a to-be-exposed region into a reverse scanning strip;

(j) reverse scanning step: reversing movement of the scanning platform to an end position of reverse scanning at the uniform speed, during movement, continuously feeding back the position data to the data processing module by the scanning platform; and according to the position data, controlling the digital micromirror device to project the frame pattern at the designated position until the processing of strip-shaped graph in a reverse direction is finished to complete reverse exposure; a reverse process is the same as a forward process except that scanning drive directions of the scanning platforms are opposite;

(k) entering the forward scanning process again after the reverse scanning of step (j) is completed until all strip-shaped graphs are processed and an entire exposure process is completed.

8. A method for controlling focal plane in a working process of the apparatus according to claim 1, comprising the following steps:

(a) before exposure starts, controlling a platform driver to move a displacement sensor to a starting point of a first scanning band by a host, and then completing a scanning action; making an optical lens not cover the first scanning band after the optical lens is placed adjacent to and contiguous with the displacement sensor; covering the first scanning band and measuring height data at different positions on the first scanning band by the displacement sensor; during a scanning operation, synchronously reading distance data of the displacement sensor on a Z-axis lifting mechanism and calculating a focal plane position of the optical lens at each scanning position according to the height data read by a Z-axis controller; then combining a calculated position of the focal plane with position data of scanning platform sent by a signal splitter synchronously and establishing a one-to-one mapping relation by the Z-axis controller;

(b) driving the screen plate forward by one step by a stepping platform, scanning back from an end position of step (a) by the scanning platform; during a scanning back process, driving the Z-axis lifting mechanism and a micro-motion adjusting mechanism to adjust a position of the optical lens according to the one-to-one mapping relation established in step (a) to complete a focal plane correction by the Z-axis controller; while scanning back, measuring height data of a second scanning band by the displacement sensor, and establishing a mapping relationship between positions of focal planes of the second scanning band and scanning platform position data at the same time by the Z-axis controller;

(c) driving the screen plate forward by one more step by the stepping platform, scanning back from an end position of step (b) once more by the scanning platform; during a scanning back process, driving the Z-axis lifting mechanism and the micro-motion adjusting mechanism to adjust a position of the optical lens according to mapping data established in step (b) to complete the focal plane correction by the Z-axis controller; while scanning back, measuring height data of a third scanning band by the displacement sensor, and establishing a mapping relationship between positions of focal planes of the third scanning band and the scanning platform position data at the same time by the Z-axis controller;

(d) repeating the above-mentioned step (b) and step (c), and driving the screen plate to advance in one step by the stepping platform every time step (b) and step (c) is repeated until the scanning is finished.

* * * * *